(12) United States Patent
Ishibashi et al.

(10) Patent No.: US 10,886,435 B2
(45) Date of Patent: Jan. 5, 2021

(54) GROUP III NITRIDE SEMICONDUCTOR WITH INGAN DIFFUSION BLOCKING LAYER

(71) Applicant: PANASONIC CORPORATION, Osaka (JP)

(72) Inventors: Akihiko Ishibashi, Osaka (JP); Akio Ueta, Hyogo (JP); Hiroshi Ohno, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 16/469,106

(22) PCT Filed: Oct. 23, 2018

(86) PCT No.: PCT/JP2018/039367
§ 371 (c)(1),
(2) Date: Jun. 12, 2019

(87) PCT Pub. No.: WO2019/097963
PCT Pub. Date: May 23, 2019

(65) Prior Publication Data
US 2020/0075810 A1    Mar. 5, 2020

(30) Foreign Application Priority Data
Nov. 16, 2017   (JP) .................. 2017-220749

(51) Int. Cl.
*H01L 33/32*      (2010.01)
*H01L 33/02*      (2010.01)

(52) U.S. Cl.
CPC .......... *H01L 33/325* (2013.01); *H01L 33/025* (2013.01)

(58) Field of Classification Search
CPC ....... H01L 33/00; H01L 33/02; H01L 33/025; H01L 33/007; H01L 33/0075;
(Continued)

(56) References Cited

U.S. PATENT DOCUMENTS 5,693,963 A * 12/1997 Fujimoto ............... H01L 33/007
257/102
2003/0015724 A1* 1/2003 Nakamura ............. H01L 33/32
257/103

(Continued)

FOREIGN PATENT DOCUMENTS

| JP | 2002-208732 A | 7/2002 |
| JP | 2015-178448 A | 10/2015 |
| JP | 2017-183697 A | 10/2017 |

OTHER PUBLICATIONS

Kuramata et al., Properties of GaN epitaxial layer grown on (111) MgAl2O4 substrate; Solid-State Electronics, vol. 41, Issue 2, Feb. 1997, pp. 251-254. (Year: 1997).*

(Continued)

*Primary Examiner* — John P. Dulka
(74) *Attorney, Agent, or Firm* — McDermott Will & Emery LLP

(57) ABSTRACT

To provide a high-quality group III nitride semiconductor. A group III nitride semiconductor including an n-GaN layer composed of $Al_xGa_{1-x}N$ ($0 \leq x < 1$), an InGaN layer disposed on the n-GaN layer and composed of InGaN, an n-AlGaN layer disposed on the InGaN layer and composed of n-type $Al_yGa_{1-y}N$ ($0 \leq y < 1$), and a functional layer disposed on the n-AlGaN layer, wherein the concentration of Mg in the n-GaN layer is higher than the concentration of Mg in the n-AlGaN layer.

9 Claims, 6 Drawing Sheets

(58) Field of Classification Search
CPC ......... H01L 33/12; H01L 33/26; H01L 33/30; H01L 33/32; H01L 33/325; H01L 29/7782; H01L 29/7783; H01L 29/7784; H01L 29/7785; H01L 29/66465; H01L 21/18; H01L 21/20; H01L 21/205; H01L 21/2053; H01L 21/2056; H01L 21/208; H01L 21/2085; H01L 21/22; H01L 21/2205; C23C 16/00; C23C 16/22; C23C 16/30; C23C 16/34; C23C 16/301; C23C 16/303; C30B 25/00; C30B 25/02; C30B 25/18; C30B 25/183; C30B 25/186; C30B 29/00; C30B 29/18; C30B 29/16; C30B 29/22; C30B 29/26; C30B 29/38
See application file for complete search history.

(56) References Cited

U.S. PATENT DOCUMENTS

2014/0197420 A1\* 7/2014 Iwai ................. C30B 29/38
257/76
2017/0279003 A1 9/2017 Ishibashi et al.

OTHER PUBLICATIONS

International Search Report issued in corresponding International Application No. PCT/JP2018/039367, dated Dec. 18, 2018, with English translation.

\* cited by examiner

GROUP III NITRIDE SEMICONDUCTOR WITH INGAN DIFFUSION BLOCKING LAYER

CROSS REFERENCE

This application is the U.S. National Phase under 35 U.S.C. § 371 of International Application No. PCT/JP2018/039367, filed on Oct. 23, 2018, which claims the benefit of Japanese Application No. 2017-220749, filed on Nov. 16, 2017, the entire contents of each are hereby incorporated by reference.

TECHNICAL FIELD

The present disclosure relates to a group III nitride semiconductor.

BACKGROUND ART

Group III nitride semiconductors can cover a wide bandgap by changing the composition of Ga, Al and In being group III elements. Such semiconductors are widely used in optical semiconductor devices such as light-emitting diodes (LEDs) and semiconductor laser diodes (LDs), and electronic devices for high-frequency and high-output applications. In general, such devices are produced by epitaxial growth of a group III nitride semiconductor layer on a sapphire substrate. A sapphire substrate, however, has a lattice mismatch of 13.8% to GaN as one of group III nitride semiconductors, represented by {(lattice constant of GaN−lattice constant of sapphire)/lattice constant of GaN}. Thus, there may be caused an increase in defect density in a group III nitride semiconductor epitaxially grown and/or the occurrence of cracks in a group III nitride semiconductor. Such phenomena currently cause deterioration in characteristics and reliability of devices.

The group III nitride semiconductor layer having such a lattice mismatch is aimed at reductions in defects and cracks, and a technique is disclosed which allows GaN to be epitaxially grown on a $ScAlMgO_4$ substrate (PTL 1). $ScAlMgO_4$ has a small lattice mismatch of −1.8% to GaN, represented by {(lattice constant of GaN−lattice constant of $ScAlMgO_4$)/lattice constant of GaN}. Accordingly, a group III nitride semiconductor epitaxially grown on a $ScAlMgO_4$ substrate is reduced in the occurrence of defects and/or the occurrence of cracks. Thus, such a semiconductor is expected to be developed to a high-quality and high-performance group III nitride semiconductor device.

CITATION LIST

Patent Literature

PTL 1
Japanese Patent Application Laid-Open No. 2015-178448

SUMMARY OF INVENTION

Technical Problem

However, epitaxial growth of a group III nitride semiconductor on a substrate made of a single crystal body represented by general formula $RAMgO_4$ (wherein R represents one or more trivalent elements selected from the group consisting of Sc, In, Y, and lanthanoids, and A represents one or more trivalent elements selected from the group consisting of Fe (III), Ga, and Al), typified by a $ScAlMgO_4$ substrate, causes Mg as a constituent element of the $ScAlMgO_4$ substrate to be incorporated into the group III nitride semiconductor.

Moreover, the $ScAlMgO_4$ substrate has a lattice constant close to the lattice constant of GaN, but has a lower lattice constant than the lattice constant of GaN. Thus, if the difference in lattice constant between the substrate and a group III nitride crystal to be epitaxially grown thereon is reduced, a higher-quality group III nitride semiconductor crystal can be obtained.

The present disclosure has been made in order to solve the above problems, and an object thereof is to provide a high-quality group III nitride semiconductor.

Solution to Problem

A group III nitride semiconductor according to the present disclosure comprises: a GaN layer composed of $Al_xGa_{1-x}N$ (0≤x<1); an InGaN layer disposed on the GaN layer and composed of InGaN; an AlGaN layer disposed on the InGaN layer and composed of $Al_yGa_{1-y}N$ (0≤y<1); and a functional layer disposed on the AlGaN layer, wherein a concentration of Mg in the GaN layer is higher than a concentration of Mg in the AlGaN layer.

Advantageous Effects of Invention

In the present disclosure, a proper degree of diffusion of Mg in a GaN layer slightly increases the lattice constant of GaN, and thus allows the lattice constant of the GaN layer to be close to the lattice constant of a functional layer. Thus, the functional layer can be hardly distorted, thereby allowing a group III nitride semiconductor having high characteristics to be provided. On the other hand, an InGaN layer can suppress Mg from being diffused into the functional layer, resulting in an enhancement in crystal quality of the functional layer. Accordingly, a high-quality group III nitride semiconductor can be provided.

DESCRIPTION OF EMBODIMENTS

Hereinafter, Embodiments of the present disclosure will be described with reference to the drawings.

Embodiment 1

Examples of the substrate for use in the present Embodiment include a $RAMgO_4$ substrate made of a single crystal body represented by $RAMgO_4$ (wherein R represents one or more trivalent elements selected from the group consisting of Sc, In, Y, and lanthanoids, and A represents one or more trivalent elements selected from the group consisting of Fe (III), Ga, and Al). Hereinafter, an example will be described where the $RAMgO_4$ substrate is a $ScAlMgO_4$ substrate, but the substrate for use in the present Embodiment is not limited to the $ScAlMgO_4$ substrate.

A single crystal of $ScAlMgO_4$ constituting the $ScAlMgO_4$ substrate has a structure where a $ScO_2$ layer having a rock salt type structure and an $AlMgO_2$ layer having a hexagonal structure are alternately stacked, and can be cleaved in the (0001) plane as in graphite and hexagonal BN. $ScAlMgO_4$ has a very low degree of lattice mismatch {(lattice constant of GaN–lattice constant of $ScAlMgO_4$)/lattice constant of GaN} of −1.8% to GaN (GaN has a slightly low lattice constant as compared with $ScAlMgO_4$), as compared with a sapphire substrate and the like. In addition, the difference in coefficients of thermal expansion between $ScAlMgO_4$ and GaN { (coefficient of thermal expansion of GaN–coefficient of thermal expansion of $ScAlMgO_4$)/coefficient of thermal expansion of GaN} is about −10.9%. A low degree of lattice mismatch is effective for a decrease in crystal defects, and it is expected that the $ScAlMgO_4$ substrate is used to form a group III nitride semiconductor layer decreased in defects.

Figure 1:
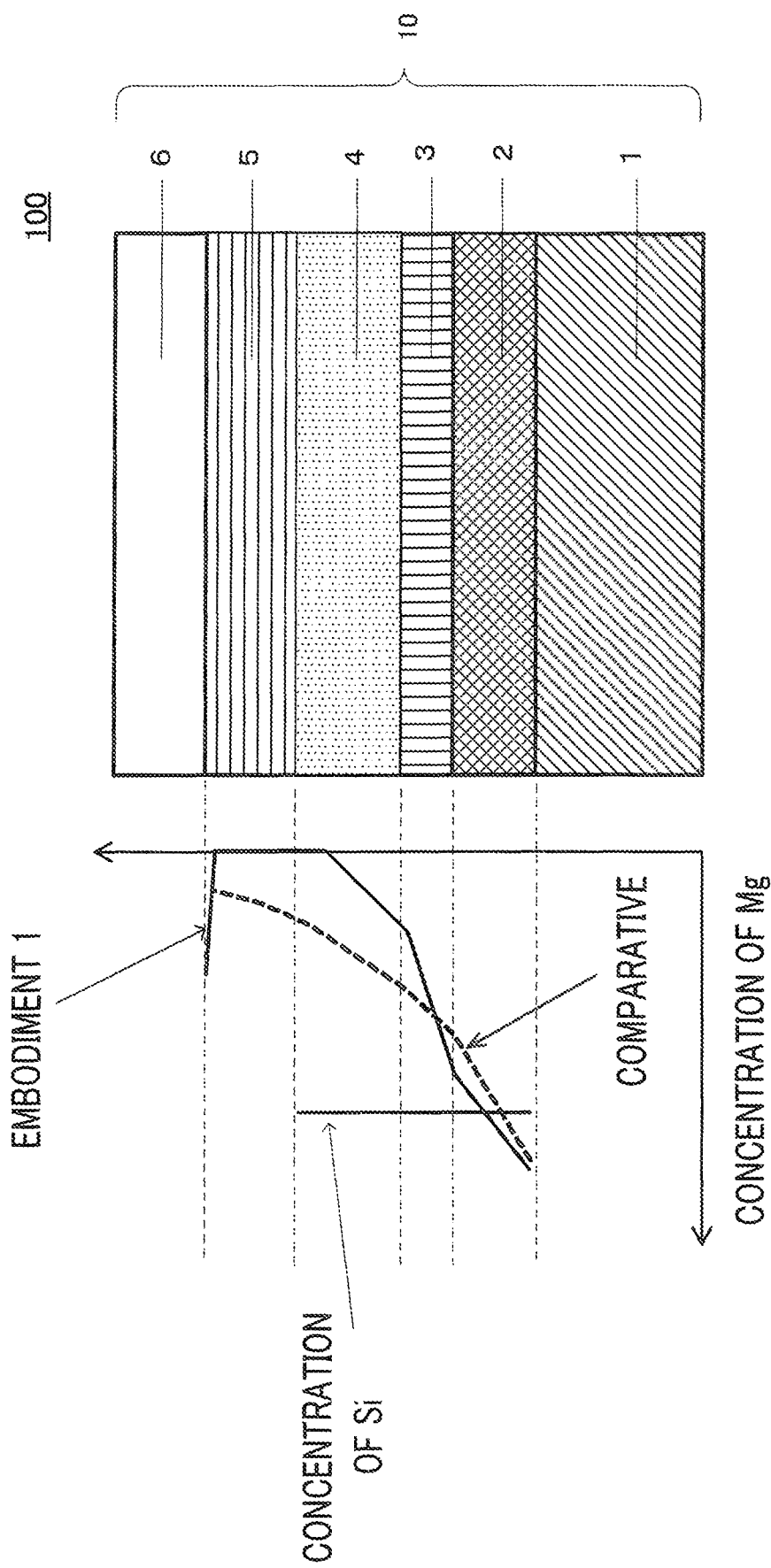
FIG. 1 illustrates an element structure including a group III nitride semiconductor according to Embodiment 1 of the present disclosure, and also illustrates the concentration profiles of impurities in certain layers.

FIG. 1 (right drawing) illustrates one configuration example of light-emitting diode (LED) 100 including group III nitride semiconductor 10 according to the present Embodiment. Light-emitting diode 100 of the present Embodiment has a configuration where Si-doped n-GaN layer 2, Si-doped n-InGaN layer 3, Si-doped n-AlGaN layer 4, InGaN light-emitting layer 5, and p-AlGaN layer 6 are disposed on $ScAlMgO_4$ substrate 1. FIG. 1 (left drawing) also illustrates the concentration profiles of impurities (Mg and Si) between Si-doped n-GaN layer 2 and InGaN light-emitting layer 5 in light-emitting diode 100.

Light-emitting diode 100 (group III nitride semiconductor 10) of the present Embodiment can be formed by epitaxial growth on a $ScAlMgO_4$ substrate with the MOCVD method (Metal Organic Chemical Vapor Deposition).

Hereinafter, one example of the method for forming light-emitting diode 100 of the present Embodiment is shown, but the present Embodiment is not limited thereto. A group III raw material for forming each layer is, for example, trimethyl gallium (TMG), trimethyl indium (TMI), or trimethyl aluminum (TMA), and a V group raw material that can be used for forming each layer is, for example, ammonia ($NH_3$) gas. A carrier gas that can be used is, for example, hydrogen or nitrogen.

First, before each layer is formed on $ScAlMgO_4$ substrate 1, $ScAlMgO_4$ substrate 1 is preferably introduced into a furnace and subjected to thermal cleaning in a hydrogen atmosphere at 1,100° C. for 10 minutes. Such thermal cleaning can remove any carbon-based contamination attached onto the surface of $ScAlMgO_4$ substrate 1.

Thereafter, the surface temperature of $ScAlMgO_4$ substrate 1 is dropped to 425° C., TMG, ammonia, and the like are fed into the furnace, and a buffer layer (not illustrated) is formed on $ScAlMgO_4$ substrate 1 at a low temperature. The thickness and the composition of the buffer layer can be adjusted depending on the growth time and the group III raw material to be fed. The buffer layer here formed is a layer made of GaN, having a thickness of 20 nm.

After formation of the buffer layer, the temperature of $ScAlMgO_4$ substrate 1 is raised to 1,125° C., resulting in formation of Si-doped n-GaN layer 2 (thickness: 3 μm). During formation of Si-doped n-GaN layer 2, not only TMG and ammonia, but also monosilane gas ($SiH_4$) as a raw material gas for doping with Si is fed with the molar ratio thereof being adjusted. The concentration of Si in n-GaN layer 2 obtained here is about $3 \times 10^{18}$ $cm^{-3}$. The "concentration" in the present disclosure means the concentration of any atom, unless particularly noted. The speed of growth is about 3 μm/h. Herein, an n-AlGaN layer may also be prepared by feeding of TMA in growth of n-GaN layer 2. That is, n-GaN layer 2 is composed of $Al_xGa_{1-x}N$ (0≤x<1).

Next, feeding of TMG and $SiH_4$ is stopped, and the substrate temperature is dropped from 1,125° C. to 700° C. in a mixed atmosphere of ammonia, hydrogen and nitrogen. Feeding of a hydrogen carrier gas is then stopped, and thereafter additional feeding of TMG, TMI and $SiH_4$ is made to form n-InGaN layer 3 (thickness: 30 nm). The amount of In can be controlled by adjustment of the molar ratio of TMG and TMI to be fed. While n-InGaN layer 3 is a layer doped with Si in the present Embodiment, the layer may also be doped with no Si. In the case of doping with Si, the concentration of Si in n-InGaN layer 3 can be about $3 \times 10^{18}$ $cm^{-3}$ as in n-GaN layer 2. The composition of In in n-InGaN layer 3 is preferably adjusted to 5 atom % to 30 atom %, more preferably adjusted to about 10 atom %. A concentration of In of more than 30 atom % may cause the lattice mismatch between GaN and InGaN to be too high, resulting in deterioration in crystallinity, and a concentration of less than 5 atom % may cause no effect of suppressing diffusion of Mg to be obtained.

Next, the substrate temperature is raised to 1,100° C. while growing a GaN layer (not illustrated) with feeding of only TMI being stopped. Such an operation is to prevent In in n-InGaN layer 3 from being evaporated in temperature rise. After the substrate temperature reaches 1,100° C., a hydrogen carrier gas and TMA are further fed to form n-AlGaN layer 4 (thickness: 0.5 μm). The concentration of Si in n-AlGaN layer 4 can be about $3 \times 10^{18}$ $cm^{-3}$ as in n-GaN layer 2. Herein, n-AlGaN layer 4 may not contain Al depending on the design of LED. That is, n-AlGaN layer 4 is composed of $Al_yGa_{1-y}N$ (0≤y<1) including an n-type dopant (which is here Si).

Next, feeding of TMG, TMA, and $SiH_4$ is stopped, and the substrate temperature is dropped from 1,100° C. to 750° C. in a mixed atmosphere of ammonia, hydrogen and nitrogen. Feeding of a hydrogen carrier gas is then stopped, and additional feeding of TMG and TMI is made to form InGaN light-emitting layer 5 (thickness: 30 nm). When the composition of In in InGaN light-emitting layer 5 is about 7 atom %, blue light at about 450 nm is emitted in LED operation. InGaN light-emitting layer 5 may be a single InGaN layer, or may be a multiple quantum well where an InGaN layer and a GaN layer are periodically stacked repeatedly. While InGaN light-emitting layer 5 is not doped, the layer may also be doped with Si, provided that the concentration of Si is about $3 \times 10^{18}$ $cm^{-3}$ or less.

Next, the substrate temperature is raised to 1,000° C. while growing a GaN layer (not illustrated) with feeding of only TMI being stopped. After the substrate temperature reaches 1,100° C., a hydrogen carrier gas, TMA and cyclopentadienyl magnesium (Cp$_2$Mg) are added to form Mg-doped p-AlGaN layer 6 (thickness: about 0.2 µm). The concentration of Mg can be about 1×10$^{19}$ cm$^{-3}$.

Herein, an n-electrode (not illustrated) is formed on a part of any of Si-doped n-GaN layer 2, n-InGaN layer 3, and n-AlGaN layer 4 in production of a device such as an LED, and such an n-electrode is preferably formed in a region (first region described below) where the concentration of Si is higher than the concentration of Mg in the case of formation of such an electrode on a part of n-GaN layer 2.

The left drawing (graph) of FIG. 1 illustrates the concentration profiles of impurities (the concentration of Mg and the concentration of Si) in light-emitting diode 100 (LED) actually produced, the diode including group III nitride semiconductor 10 of the present Embodiment. The concentration of Mg was analyzed by a SIMS method (Secondary ION Mass Spectrometry). The concentration of Mg in n-GaN layer 2 located closest to ScAlMgO$_4$ substrate 1 had a highest value in a region in contact with ScAlMgO$_4$ substrate 1, and is about 1×10$^{19}$ cm$^3$ to 1×10$^{22}$ cm$^{-3}$.

A comparative light-emitting diode having the same structure except that no n-InGaN layer 3 is included was also produced, and was subjected to profiling of the concentrations of impurities. The concentration of Mg in the light-emitting diode is monotonically decreased as the measurement position is farther from the ScAlMgO$_4$ substrate towards the surface of the diode, as illustrated in a dotted line in the left drawing (graph) of FIG. 1. The reason is because a Mg atom constituting ScAlMgO$_4$ substrate 1 is diffused in the group III nitride semiconductor formed thereon. As illustrated in FIG. 1, a Mg atom is diffused into InGaN light-emitting layer 5 in the comparative light-emitting diode including no n-InGaN layer 3. Such a Mg atom diffused forms point defects such as an interstitial atom in InGaN light-emitting layer 5, and thus serves as a non-light-emission center to thereby reduce the luminous efficiency of an LED. The reduced luminous efficiency causes a carrier subjected to electricity injection in device operation to be converted to heat, resulting in degradation of such a light-emitting layer itself and/or an electrode and thus deterioration in reliability.

On the contrary, the light-emitting diode of the present Embodiment, including n-InGaN layer 3, allows diffusion of a Mg atom from ScAlMgO$_4$ substrate 1 to be suppressed in n-InGaN layer 3 as illustrated by a solid line in the left drawing (graph) of FIG. 1, resulting in a significant decrease in the concentration of Mg in n-AlGaN layer 4 as compared with the concentration of Mg in n-GaN layer 2. Thus, the concentration of Mg in InGaN light-emitting layer 5 is decreased to about 2 to 3×10$^{16}$ cm$^{-3}$ or less which corresponds to the detection limit of the SIMS method. In other words, n-InGaN layer 3 suppresses diffusion of Mg, thereby allowing the concentration of Mg in n-GaN layer 2 to be higher than the concentration of Mg in n-AlGaN layer 4, in the present Embodiment.

Here, n-AlGaN layer 4 has the function of efficient injection of an electronic carrier into InGaN light-emitting layer 5. A large amount of Mg present in n-AlGaN layer 4 naturally results in a large amount of Mg diffused to InGaN light-emitting layer 5. On the contrary, diffusion of Mg is suppressed by the ability to prevent diffusion of n-InGaN layer 3, thereby resulting in a low concentration of Mg in n-AlGaN layer 4, and a higher concentration of the n-type dopant in n-AlGaN layer 4 than the concentration of Mg in n-AlGaN layer 4.

In the present Embodiment, all the concentrations of Si in Si-doped n-GaN layer 2, n-InGaN layer 3, and n-AlGaN layer 4 are about 3×10$^{18}$ cm$^{-3}$. In addition, the concentration of Si diffused in a stacked structure is higher than the concentration of Mg diffused therein except for a region of n-GaN layer 2, in contact with ScAlMgO$_4$ substrate 1. In the following description, a region of n-GaN layer 2, being located closer to ScAlMgO$_4$ substrate 1 and having the concentration of Si lower than the concentration of Mg is also referred to as "second region", and a region of n-GaN layer 2, being located closer to n-InGaN layer 3 and having the concentration of Si higher than the concentration of Mg is also referred to as "first region".

While the region in n-GaN layer 2, in contact with ScAlMgO$_4$ substrate 1, namely, a region (second region) having the concentration of Mg higher than the concentration of Si, can have a thickness of about 2 µm in the present Embodiment, as described below, such a thickness cannot be increased and thus is about 0.3 µm in the case where no n-InGaN layer 3 is inserted. As described above, the rate of decrease in the concentration of Mg in the thickness direction in n-InGaN layer 3 is higher than the rate of decrease in concentration of Mg in the thickness direction in n-GaN layer 2. Thus, in the case where n-InGaN layer 3 is disposed, Mg is inhibited from being diffused towards n-InGaN layer 3 and thus easily collected in a region closer to ScAlMgO$_4$ substrate 1 rather than n-InGaN layer 3. On the other hand, in the case where n-InGaN layer 3 is not disposed, Mg is easily diffused towards InGaN light-emitting layer 5, resulting in a decrease in the concentration of Mg in a region of n-GaN layer 2, in contact with ScAlMgO$_4$ substrate 1, and a decrease in the thickness of the second region.

Figure 3:
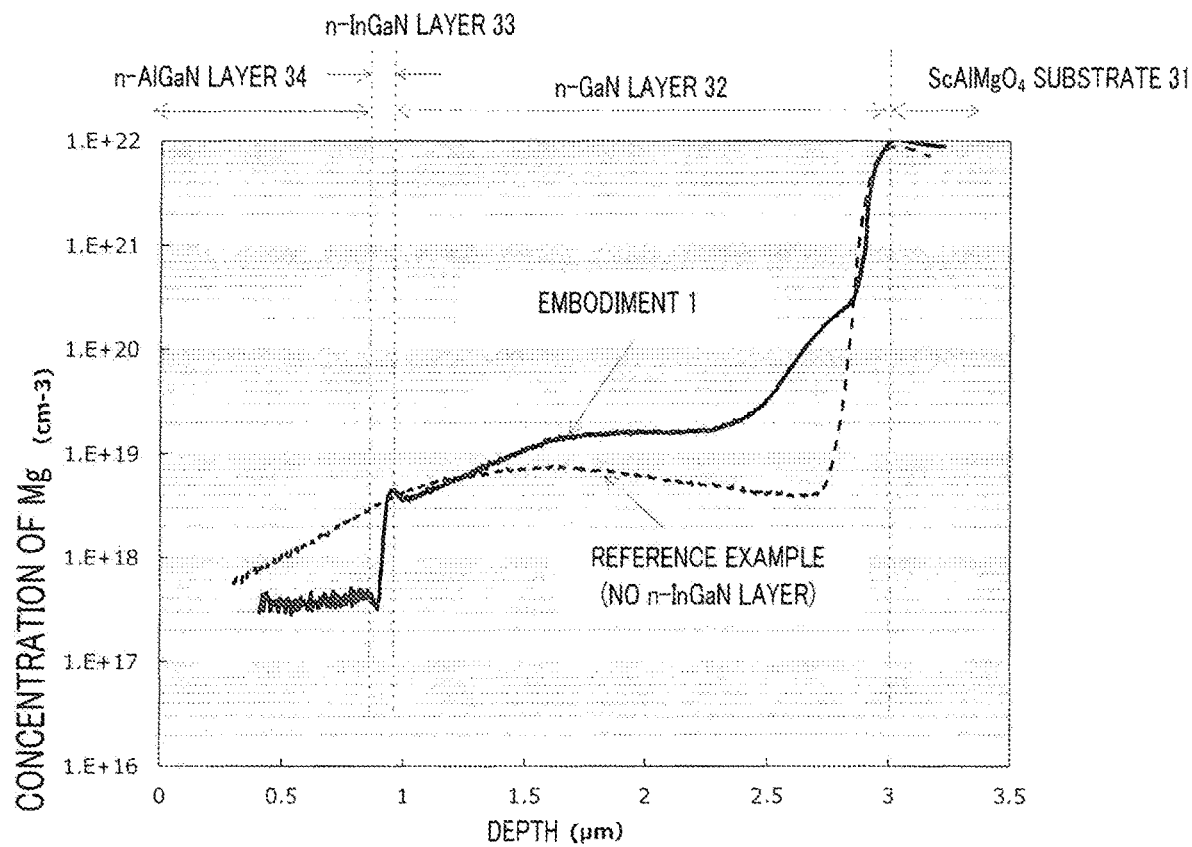
FIG. 3 illustrates the concentration profile of Mg, which represents the effect of suppressing diffusion of Mg by an n-InGaN layer in Embodiment 1 of the present disclosure.

The concentration profile of Mg is described in more detail with reference to FIG. 3. FIG. 3 illustrates comparison of the concentration profile of Mg according to the SIMS method, between a case where n-InGaN layer 3 is included as a diffusion prevention layer as in the present Embodiment (solid line) and a case where no n-InGaN layer 3 is included (dashed line). The comparison was performed between a stacked product (stacked product of the present Embodiment) produced by stacking ScAlMgO$_4$ substrate 31/n-GaN layer 32/n-InGaN layer 33/n-AlGaN layer 34 in the order presented, and a stacked product (Reference Example) produced by stacking ScAlMgO$_4$ substrate 31/n-GaN layer 32/n-AlGaN layer 34 in the order presented.

The concentration of Mg in Reference Example is monotonically decreased as the measurement position is farther from ScAlMgO$_4$ substrate 31 towards n-AlGaN layer 34, as illustrated by a dashed line in FIG. 3. The concentration of Mg is decreased to the same level (about 3×10$^{18}$ cm$^{-3}$) as that of Si for doping, at a position of about 2 µm away from the interface between ScAlMgO$_4$ substrate 31 and n-GaN layer 32. On the other hand, the concentration of Mg in a structure including n-InGaN layer 33, of the present Embodiment, is decreased as the measurement position is farther from ScAlMgO$_4$ substrate 31 towards n-AlGaN layer 34, but is significantly changed in n-InGaN layer 33, as illustrated by a solid line in FIG. 3. The concentration of Mg at the interface between n-InGaN layer 33 and n-AlGaN layer 34 is about 3×10$^{17}$ cm$^{-3}$, and decreases by one order of magnitude as compared with the concentration of Mg at the interface between n-GaN layer 32 and n-InGaN layer 33. While the effect of suppressing diffusion of Mg by n-InGaN layer 33 is not sufficiently figured out, it is presumed that replacement with an In atom having a larger atomic radius than that of Ga allows diffusion of Mg via an interstitial position or a Ga atom position to be suppressed.

Figure 4:
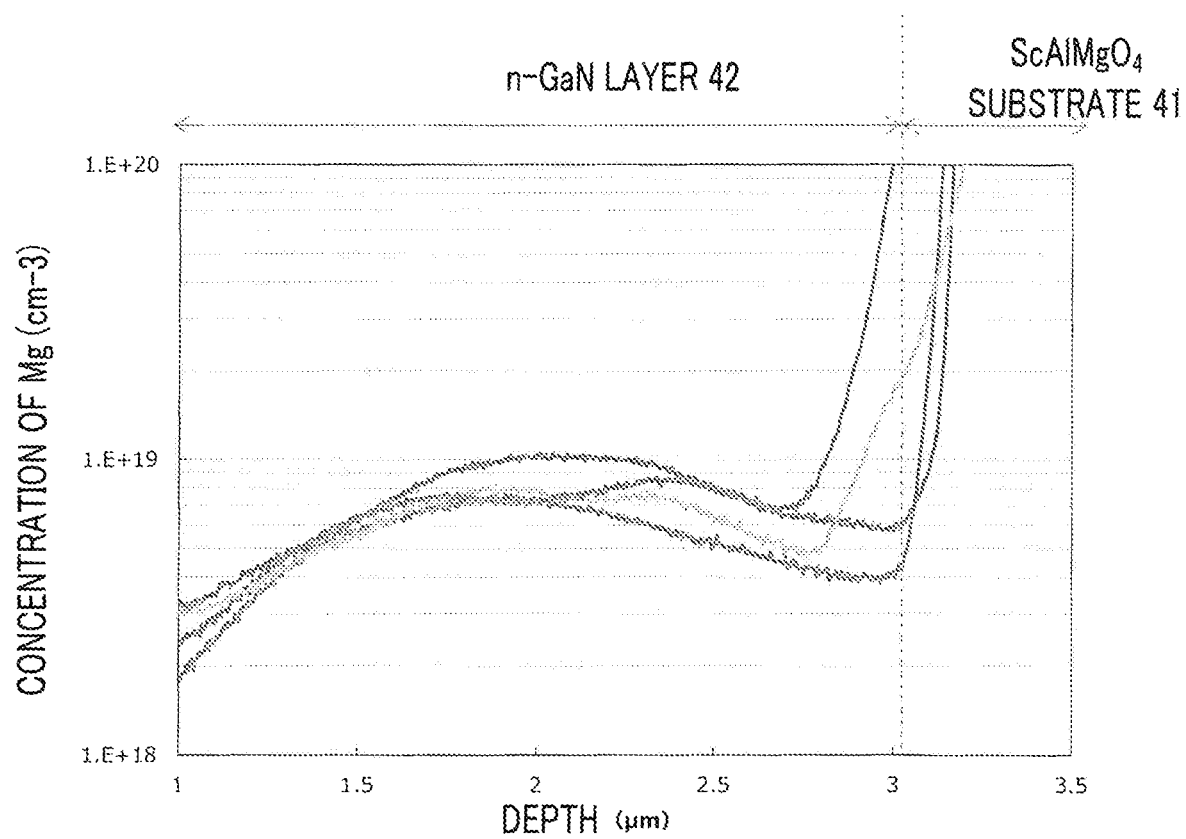
FIG. 4 illustrates the concentration profile of Mg, which represents diffusivity of Mg in the group III nitride semiconductor according to Embodiment 1 of the present disclosure.

FIG. 4 illustrates the results of measurement of the depth profile of the concentration of Mg with respect to diffusion of a Mg atom into a group III nitride semiconductor, by the SIMS method. Evaluation was made for four stacked products prepared by stacking only n-GaN layer 42 as a single layer (about 5 μm) on ScAlMgO$_4$ substrate 41 with a low-temperature GaN buffer layer being interposed therebetween. No InGaN layer is formed. As illustrated in FIG. 4, the concentration of Mg is likely slightly increased in part in a region of n-GaN layer 42, near ScAlMgO$_4$ substrate 41, but is decreased as the measurement position is farther from ScAlMgO$_4$ substrate 41, and is decreased to the same concentration (2 to 3×10$^{18}$ cm$^{-3}$) as the concentration of Si as an n-type dopant in the present Embodiment, around a region away from the interface between ScAlMgO$_4$ substrate 41 and n-GaN layer 42 by a thickness of 2 μm. In general, it is known that a Mg atom in GaN has electric characteristics of acceptor impurities, and the acceptor level is deep and the electrical activation efficiency is about 10%. Accordingly, it is preferable for no decrease in the concentration of an n-type carrier based on Si due to compensation of Mg that the concentration of Mg be about 1/10 of the concentration of Si. In the case where the concentration of Mg is 1/10 of the concentration of Si, the amount of Mg electrically activated is 1/100 (1%).

Thus, formation of n-InGaN layer 3 on n-GaN layer 42 having a thickness of 2 μm or more (corresponding to a thickness allowing the concentration of Si and the concentration of Mg to be the same or less) enables the amount of Mg electrically activated to be decreased to about 1%, as described above.

As described above, the lattice constant of GaN is extremely close to, but is slightly lower than that of the ScAlMgO$_4$ substrate (rate of lattice mismatch: −1.8%). In the case of formation of n-GaN layer 2 on ScAlMgO$_4$ substrate 1 as in the present Embodiment, diffusion of 1×10$^{19}$ cm$^{-3}$ or more of Mg into n-GaN layer 2 results in a slight increase in the lattice constant, thereby allowing the lattice constant of ScAlMgO$_4$ substrate 1 to be closer to that of n-GaN layer 2, resulting in suppression of the occurrence of defects at the same interface. In the present Embodiment, n-InGaN layer 33 is included, and thus diffusion of Mg is limited in the layer as illustrated in FIG. 3. Accordingly, the concentration of Mg in n-GaN layer 32 is likely to be higher than that in Reference Example including no n-InGaN layer 33, resulting in a further improvement in lattice matching. As described above, the thickness in a region where the concentration of Mg in n-GaN layer 2 is 1×10$^{19}$ cm$^{-3}$ or more is likely to be increased, and can be, for example, 0.5 to 2.0 μm (a typical value is about 1.5 μm), in the structure of the present Embodiment. The thickness is significantly thicker than the thickness (about 0.2 μm) in n-GaN layer 2 in Reference Example. In order to provide a sufficiently high lattice constant in the second region of n-GaN layer 2, the thickness in a region where the concentration of Mg in n-GaN layer 2 is 1×10$^{19}$ cm$^{-3}$ or more is preferably 0.5 μm or more, more preferably 1 μm or more.

A further increase in the lattice constant of n-GaN layer 2 or the like due to diffusion of Mg easily allows the lattice constant of InGaN light-emitting layer 5 and the lattice constant of n-AlGaN layer 4 or the like, which are higher than the lattice constant of GaN, to be close to each other. In other words, any distortion remaining in InGaN light-emitting layer 5 is decreased to improve light-emitting characteristics, according to the present Embodiment.

A concentration of Mg of more than 1×10$^{22}$ cm$^{-3}$ in the second region of n-GaN layer 2 is not preferable because the crystal quality of GaN is deteriorated. Accordingly, the concentration of Mg in the second region of n-GaN layer 2 is desirably 1×10$^{19}$ cm$^{-3}$ or more and 1×10$^{22}$ cm$^{-3}$ or less.

Thus, in the present Embodiment, n-InGaN layer 3 can be used as a diffusion prevention layer of Mg, resulting in suppression of defects at the interface between the ScAlMgO$_4$ substrate and n-GaN layer 2 and suppression of diffusion of a Mg atom serving as a non-light-emission center into InGaN light-emitting layer 5 at the same time. In particular, n-InGaN layer 3 can be disposed at a position of 2 μm or more away from the interface between ScAlMgO$_4$ substrate 1 and n-GaN layer 2, thereby providing an LED structure where the concentration of an n-type carrier is kept.

Figure 5:
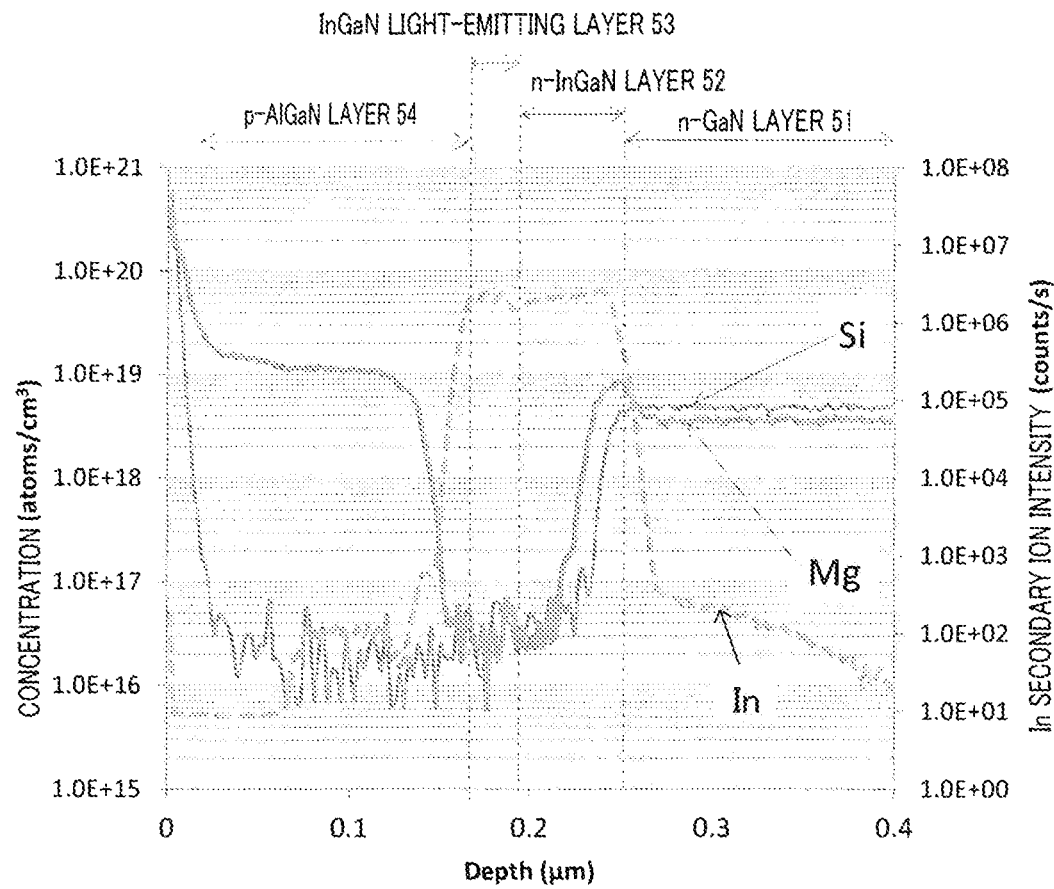
FIG. 5 illustrates the concentrations of impurities and the depth profile of the secondary ion intensity of a constituent element (In) in a group III nitride semiconductor light-emitting element as measured by secondary ion mass spectrometry (SIMS), according to Embodiment 1 of the present disclosure.

FIG. 5 illustrates the concentration profiles of impurities in a light-emitting diode including n-GaN layer 51, n-InGaN layer 52, InGaN light-emitting layer 53, and p-AlGaN layer 54 stacked. In the light-emitting diode, n-InGaN layer 52 is used as a diffusion prevention layer of Mg. FIG. 5 illustrates the concentrations of impurities (Mg and Si) (solid lines) around InGaN light-emitting layer 53 of an LED produced on a ScAlMgO$_4$ substrate (not illustrated), and also illustrates the depth profile (in proportion to the concentration of In: dashed line) of the secondary ion intensity of an In atom. As illustrated in FIG. 5, it has been confirmed that a Mg atom (to a concentration of 3 to 4×10$^{18}$ cm$^{-3}$) diffused from the ScAlMgO$_4$ substrate (not illustrated) into n-GaN layer 51 is suppressed in diffusion in n-InGaN layer 52 and the concentration of Mg in InGaN light-emitting layer 53 is decreased to the order of 10$^{16}$. On the other hand, p-AlGaN layer 54 located closer to the surface of the LED is doped with Mg, and thus has a concentration of Mg of about 1 to 2×10$^{19}$ cm$^{-3}$. The concentration of Si in n-GaN layer 51 is about 5×10$^{18}$ cm$^3$, and is higher than the concentration of Mg (3 to 4×10$^{18}$ cm$^{-3}$) diffused from the ScAlMgO$_4$ substrate. While FIG. 5 does not illustrate any AlGaN layer disposed between InGaN light-emitting layer 53 and n-InGaN layer 52 for convenience, the same effect is obtained even in the case of formation of any AlGaN layer therebetween. FIG. 5 illustrates an enlarged view of the vicinity of InGaN light-emitting layer 52 in a semiconductor apparatus, and does not illustrate the ScAlMgO$_4$ substrate and the second region (a region located closer to the ScAlMgO$_4$ substrate, where the concentration of an n-type dopant is lower than the concentration of Mg) in n-GaN layer 51. Herein, while the concentration of Si and the concentration of Mg are apparently substantially the same in InGaN light-emitting layer 53, both the concentrations are traces equal to or less the measurement limit, and thus it can also be interrupted that neither Mg nor Si is contained in InGaN light-emitting layer 53.

Although suppression of diffusion of Mg from the ScAlMgO$_4$ substrate has been disclosed in the present Embodiment, the effect of the present Embodiment is not limited to such suppression, and any effect is exerted also in the case of no use of any ScAlMgO$_4$ substrate and the case of intentional or unintentional doping with Mg.

A too thick n-InGaN layer 3 can cause absorption of light from a light-emitting layer in LED device operation to be lost. Accordingly, the thickness of n-InGaN layer 3 is less than the thickness of n-GaN layer 2 or n-AlGaN layer 4. On the other hand, not a too thin n-InGaN layer 3 is preferable from the viewpoint that n-GaN layer 2 includes a relatively large amount of Mg and the thickness in a region (second region) having a high lattice constant is increased (increased to 0.5 μm or more). Specifically, the thickness is preferably 3 nm to 100 nm, more preferably 10 to 80 nm.

Embodiment 2

Figure 2:
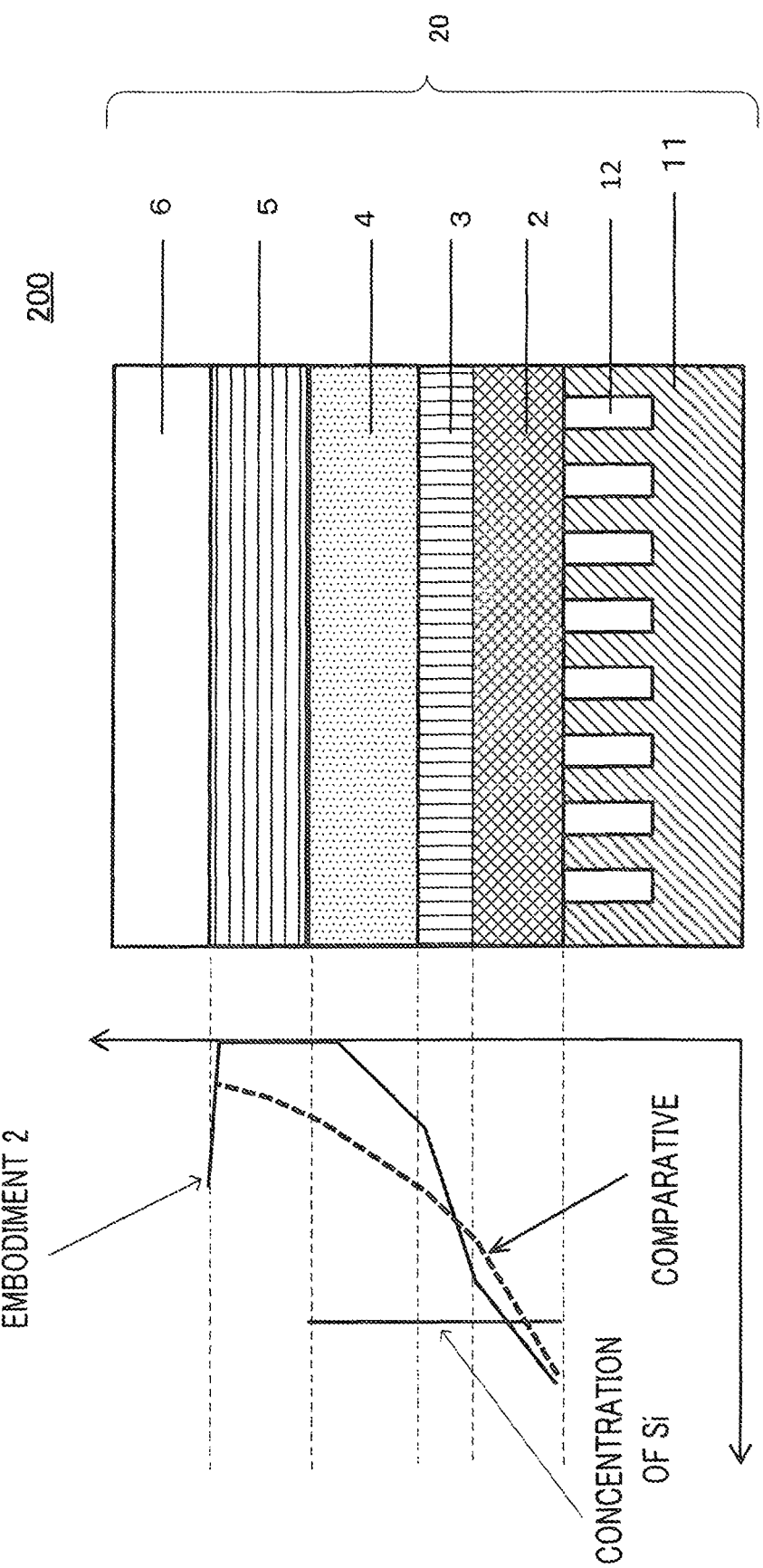
FIG. 2 illustrates an element structure including a group III nitride semiconductor according to Embodiment 2 of the present disclosure, and also illustrates the concentration profiles of impurities in certain layers.

Light-emitting diode 200 (group III nitride semiconductor 20) of the present Embodiment has a configuration where Si-doped n-GaN layer 2, Si-doped n-InGaN layer 3, Si-doped n-AlGaN layer 4, InGaN light-emitting layer 5, and p-AlGaN layer 6 are disposed on ScAlMgO$_4$ substrate 11, as illustrated in FIG. 2. FIG. 2 also illustrates the concentration profiles of impurities (Mg and Si) between Si-doped n-GaN layer 2 and InGaN light-emitting layer 5 in light-emitting diode 200 (left drawing). Si-doped n-GaN layer 2, Si-doped n-InGaN layer 3, Si-doped n-AlGaN layer 4, InGaN light-emitting layer 5, and p-AlGaN layer 6 are the same as in Embodiment 1, and thus the detail description thereof is omitted.

In the present Embodiment, protrusions and recesses are formed in a stripe pattern on the ScAlMgO$_4$ substrate. First, a dielectric mask layer such as SiO$_2$ is deposited on the ScAlMgO$_4$ substrate, and the upper surface of the mask layer is coated with a resist film. Thereafter, the resist film coated is patterned in a stripe pattern according to a photolithography method. Thus, a resist pattern is formed. Next, a part of the mask layer is removed by etching, thereby resulting in not only formation of a stripe-shaped protrusion portion, but also formation of a plurality of openings. For example, dry etching is performed to thereby form a plurality of periodic structures on the mask layer, the structures each having an opening portion having a cross-sectional width of about 3 μm and a protrusion portion having a cross-sectional width of about 12 μm as one cycle.

Next, the mask is removed to allow n-GaN layer 2 to be formed on ScAlMgO$_4$ substrate 11 having protrusions and recesses with a low-temperature GaN buffer layer (not illustrated) being interposed therebetween. A GaN crystal is grown upward and laterally from each protrusion portion of ScAlMgO$_4$ substrate 11 having protrusions and recesses. The GaN crystal formed on each protrusion portion is bound and thus formed into flat n-GaN layer 2. As a result, void portion 12 is formed between n-GaN layer 2 and ScAlMgO$_4$ substrate 11 having protrusions and recesses. GaN on void portion 12 corresponds to a crystal laterally grown, and is formed not in contact with the ScAlMgO$_4$ substrate as a different substrate and thus is a high-quality crystal extremely less in dislocation. Thereafter, Si-doped n-InGaN layer 3, Si-doped n-AlGaN layer 4, InGaN light-emitting layer 5, and p-AlGaN layer 6 are stacked, thereby providing light-emitting diode 200 of the present Embodiment. Herein, the method for forming the layers to be formed after n-InGaN layer 3 and the configurations of such layers are the same as in Embodiment 1.

The ScAlMgO$_4$ substrate having protrusions and recesses is used, resulting in not only the effect of reducing dislocation, but also the effect of increasing the extraction efficiency due to light outwardly radiated by light scattering with such protrusions and recesses in LED device operation.

Formation of protrusions and recesses on the ScAlMgO$_4$ substrate is not limited to a stripe manner, and the same effects are exerted even in the case of formation of protrusions and recesses in an island-shaped manner, and the periodicity is also not necessarily required.

(Others)

Although the above Embodiments have disclosed growth of GaN in the +c plane direction by use of the ScAlMgO$_4$ substrate having the (0001) plane, the same effects are also obtained with respect to growth in the −c plane direction (N plane) with growth conditions of GaN being appropriately adjusted. The same effects are also obtained in the case of use of an off substrate where the c-axis is inclined by about 0.2 to 5 degrees in any direction.

Furthermore, while the case where the substrate is ScAlMgO$_4$ is described above as an example, the same effects are obtained as long as any substrate represented by general formula RAMgO$_4$ is adopted. Such a substrate represented by RAMgO$_4$ is constituted by a substantially single crystal material represented by general formula RAMgO$_4$. In the general formula, R represents one or more trivalent elements selected from the group consisting of Sc, In, Y, and lanthanoids (atomic number: 67 to 71), and A represents one or more trivalent elements selected from the group consisting of Fe (III), Ga, and Al. The "substantially single crystal material" refers to a crystalline solid containing 90 atom % or more of RAMgO$_4$ constituting a plane epitaxially grown and being the same in the orientation even in any portion of the plane epitaxially grown with respect to any crystal axis. It is noted that not only any solid having a crystal axis locally changed in the orientation, but also any solid locally including lattice defects is treated as such a single crystal. Herein, O represents oxygen and Mg represents magnesium. As described above, R preferably represents Sc and A preferably represents Al.

A main group III elemental metal constituting group III nitride is most preferably gallium (Ga), and such a main group III elemental metal may be, for example, aluminum (Al), indium (In), or thallium (Tl). Such metals may be used singly or in combinations of two or more kinds thereof. For example, the n-InGaN layer may further contain aluminum (Al). In such a case, the composition of the n-InGaN layer is represented by Al$_s$Ga$_t$In$_{\{1-(s+t)\}}$N (wherein 0≤s<1, 0≤t<1, and s+t<1).

The n-type dopant is not particularly limited, and examples include oxygen and Ge, in addition to Si. While the MOCVD method is used in the present Examples, the same effects can also be obtained with a HYPE method, an OVPE (Oxygen Vapor Phase Epitaxy) method, a sputtering method, a MBE method, or the like as the epitaxial growth method.

While an aspect where each layer to be formed between the ScAlMgO$_4$ substrate and the InGaN light-emitting layer is of n-type is described above as a preferable example, an aspect where the dopant in each layer is not activated can also be encompassed within the scope of the present disclosure. Specifically, GaN layer 2 illustrated in FIG. 1 or FIG. 2 may be composed of any type such as n-type, p-type or i-type. Furthermore, AlGaN layer 4 may also be composed of any type such as n-type, p-type or i-type.

That is, the present disclosure provides a group III nitride semiconductor including a GaN layer composed of Al$_x$Ga$_{1-x}$N (0≤x<1), an InGaN layer disposed on the GaN layer and composed of InGaN, an AlGaN layer including a dopant, the layer being disposed on the InGaN layer and composed of Al$_y$Ga$_{1-y}$N (0≤y<1), and a functional layer disposed on the AlGaN layer, wherein the concentration of Mg in the GaN layer is higher than the concentration of Mg in the AlGaN layer, and the concentration of the dopant in the AlGaN layer is higher than the concentration of Mg in the AlGaN layer.

In the case where the GaN layer includes a dopant, as described above, the GaN layer preferably has a first region that is located closer to the InGaN layer and has a higher concentration of the dopant than the concentration of Mg, and a second region that is located opposite to the first region and has a lower concentration of the dopant than the concentration of Mg. In such a case, the dopant may also be a p-type dopant.

As described above, the dopant included in AlGaN layer 4 is preferably an n-type dopant. Furthermore, the n-type dopant is preferably Si.

As one example of the functional layer, has been described above a light-emitting diode provided with InGaN light-emitting layer 5. The functional layer, however, is not limited to such an InGaN light-emitting layer, and can be any functional layer or the like for various semiconductors. One example of such semiconductors includes a power device (Embodiment 3 described below) including a channel layer as such a functional layer.

Embodiment 3

A power device according to the present Embodiment includes a GaN layer composed of $Al_xGa_{1-x}N$ ($0 \leq x < 1$), an InGaN layer disposed on the GaN layer and composed of InGaN, an AlGaN layer disposed on the InGaN layer and composed of $Al_yGa_{1-y}N$ ($0 \leq y < 1$), and a channel layer as one example of a functional layer disposed on the AlGaN layer, wherein the concentration of Mg in the GaN layer is higher than the concentration of Mg in the AlGaN layer, and the concentration of the dopant in the AlGaN layer is higher than the concentration of Mg in the AlGaN layer.

Figure 6:
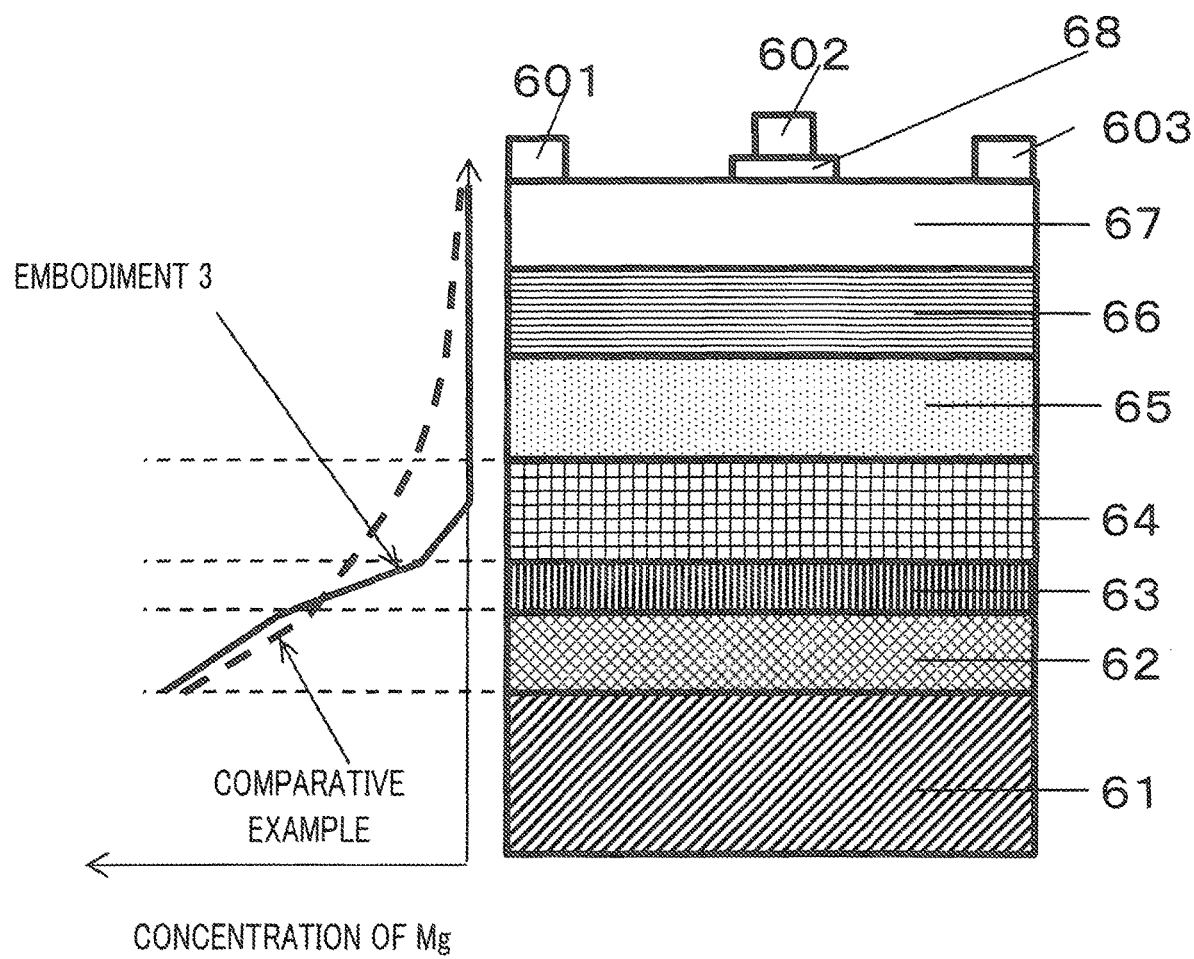
FIG. 6 illustrates an element structure including a group III nitride semiconductor according to Embodiment 3 of the present disclosure and also illustrates the concentration profile of Mg.

FIG. 6 (right drawing) illustrates one example of an element structure of the power device according to the present Embodiment. First GaN buffer layer 62 as one example of a GaN layer is disposed on $ScAlMgO_4$ substrate 61, and InGaN diffusion suppression layer 63 as one example of an InGaN layer is disposed thereon. Furthermore, second GaN buffer layer 64 and AlGaN back barrier layer 65 (the composition of Al is, for example, 3%, and the thickness is, for example, 0.5 μm) are disposed thereon, and GaN channel layer 66 (the thickness is, for example, 0.15 μm) as one example of a functional layer is disposed thereon. Furthermore, AlGaN barrier layer 67 (the composition of Al is, for example, 20%, and the thickness is, for example, 0.05 μm) is disposed thereon. Such a stacked structure is sequentially formed by the MOCVD method as in Embodiments 1 and 2. Furthermore, respective electrodes required for transistor operation, including source electrode 601, gate electrode 602 on p-type GaN layer 68, and drain electrode 603, are disposed on AlGaN barrier layer 67.

GaN channel layer 66 is required to be a high-quality and high-resistivity layer having few impurities and defects, for the purpose of an enhancement in mobility of a two-dimensional electron gas. The reason is because the presence of impurities and defects in GaN channel layer 66 causes a two-dimensional electron gas to be thus scattered, thereby not allowing any desired functions to be performed. Such a presence of impurities and defects in GaN channel layer 66 also causes the problem of the occurrence of current collapse, for example, an increase in on-resistance due to capturing of any electron accelerated by the voltage stress in operation of the power device.

FIG. 6 (left drawing) illustrates the concentration of Mg between first GaN buffer layer 62 and AlGaN barrier layer 67 in the power device of the present Embodiment by a solid line. The concentration of Mg is measured by the same method as described above. As illustrated in the left drawing (graph) of FIG. 6, diffusion of Mg from $ScAlMgO_4$ substrate 61 is suppressed in InGaN diffusion suppression layer 63. Such suppression can be seen from a very lower concentration of Mg in second GaN buffer layer 64 than the concentration of Mg in first GaN buffer layer 62. In other words, the power device of the present Embodiment can allow GaN channel layer 66 to be kept as a high-quality layer including no impurities and to maximally perform the function of a channel layer.

In the power device of the present Embodiment, the concentration of each dopant is higher than the concentration of Mg diffused in the stacked structure, except for a region of first GaN buffer layer 62, in contact with $ScAlMgO_4$ substrate 61. Also in the power device of the present Embodiment, a second region of first GaN buffer layer 62, located closer to $ScAlMgO_4$ substrate 61, having the concentration of the dopant lower than the concentration of Mg, and a first region of first GaN buffer layer 62, located closer to InGaN diffusion suppression layer 63, having the concentration of the dopant higher than the concentration of Mg are formed.

FIG. 6 (left drawing) here also illustrates the concentration profile of Mg in a power device having the same structure except for no formation of InGaN diffusion suppression layer 63 (Comparative Example), by a dashed line. In the Comparative Example, Mg is diffused into GaN channel layer 66, resulting in degradations in characteristics, such as an increase in on-resistance.

Also in the power device of the present Embodiment, Mg can be diffused from $ScAlMgO_4$ substrate 61 into first GaN buffer layer 62 to result in an increase in lattice constant of GaN, as in the light-emitting diodes of Embodiment 1 and Embodiment 2. Accordingly, a lattice mismatch slightly present between $ScAlMgO_4$ substrate 61 and a layer grown thereon (for example, GaN channel layer 66) can be reduced to result in a reduction in such distortion.

A typical thickness of first GaN buffer layer 62 on $ScAlMgO_4$ substrate 61 is here about 3 μm, and the defect density calculated from the dark spot density according to a cathode luminescence (CL) method is about $5 \times 10^7$ cm$^{-2}$. On the other hand, the defect density in the case of use of a Si substrate conventionally frequently used as a substrate for power devices is $10^8$ to $10^9$ cm$^{-2}$. In other words, the defect density is significantly lowered in the present Embodiment as compared with the case of use of a conventional Si substrate.

For example, the entire region or a partial region of AlGaN back barrier layer 65 is not necessarily doped with n-type impurities such as Si in order that the power device of the present Embodiment ensures a high withstanding pressure.

A main group III elemental metal constituting group III nitride is most preferably gallium (Ga), and such a main group III elemental metal may be, for example, aluminum (Al), indium (In), or thallium (Tl). Such metals may be used singly or in combinations of two or more kinds thereof. For example, in the case where indium is contained, the composition thereof is represented by $Al_sGa_tIn_{\{1-(s+t)\}}N$ (wherein $0 \leq s < 1$, $0 \leq t < 1$, and $s+t<1$).

The present application claims the priority based on Japanese Patent Application No. 2017-220749 filed on Nov. 16, 2017. All the contents described in the specification and the drawings filed are herein incorporated.

INDUSTRIAL APPLICABILITY

The group III nitride semiconductor according to the present disclosure can provide a high-quality, high-reliability, and high-performance group III nitride device that has a small lattice mismatch and that is also suppressed in diffusion of impurities from a substrate to functional layers such as a light-emitting layer and a channel layer.

REFERENCE SIGNS LIST 1, 11, 31, 41, 61: $RAMgO_4$ ($ScAlMgO_4$) substrate
2, 32, 42, 51: n-GaN layer
3, 33, 52: n-InGaN layer
4, 34: n-AlGaN layer 5, 53: InGaN light-emitting layer
6, 54: p-AlGaN layer
10, 20: group III nitride semiconductor
62: First GaN buffer layer
63: InGaN diffusion suppression layer
64: Second GaN buffer layer
65: AlGaN back barrier layer
66: GaN channel layer
67: AlGaN barrier layer
68: p-type GaN layer
100, 200: light-emitting diode
601: source electrode
602: gate electrode
603: drain electrode

The invention claimed is:

1. A group III nitride semiconductor, comprising:
a GaN layer composed of $Al_xGa_{1-x}N$ ($0 \leq x < 1$);
an InGaN layer disposed on the GaN layer and composed of InGaN;
an AlGaN layer disposed on the InGaN layer and composed of $Al_yGa_{1-y}N$ ($0 \leq y < 1$) comprising a dopant; and
a functional layer disposed on the AlGaN layer, wherein
a concentration of Mg in the GaN layer is higher than a concentration of Mg in the AlGaN layer, and
a concentration of the dopant in the AlGaN layer is higher than the concentration of Mg in the AlGaN layer,
wherein the GaN layer comprises a dopant, and includes
a first region that is located closer to the InGaN layer and has a higher concentration of the dopant than the concentration of Mg, and
a second region that is located opposite to the first region and has a lower concentration of the dopant than the concentration of Mg.

2. The group III nitride semiconductor according to claim 1, wherein the second region of the GaN layer has a concentration of Mg of $1 \times 10^{19}$ cm$^{-3}$ or more and $1 \times 10^{22}$ cm$^{-3}$ or less.

3. The group III nitride semiconductor according to claim 1, wherein the second region of the GaN layer has a thickness of 0.5 μm or more and 2 μm or less.

4. The group III nitride semiconductor according to claim 1, wherein:
the GaN layer is placed on a substrate, and
the substrate is a $RAMgO_4$ substrate made of a single crystal body represented by general formula $RAMgO_4$, wherein R represents one or more trivalent elements selected from the group consisting of Sc, In, Y, and lanthanoids, and A represents one or more trivalent elements selected from the group consisting of Fe (III), Ga, and Al.

5. The group III nitride semiconductor according to claim 1, wherein a rate of decrease in a concentration of Mg in a thickness direction in the InGaN layer is higher than a rate of decrease in a concentration of Mg in a thickness direction in the GaN layer.

6. The group III nitride semiconductor according to claim 1, wherein the dopant included in the AlGaN layer is an n-type dopant.

7. The group III nitride semiconductor according to claim 6, wherein the n-type dopant is Si.

8. The group III nitride semiconductor according to claim 1, wherein the functional layer is a light-emitting layer.

9. The group III nitride semiconductor according to claim 1, wherein the functional layer is a channel layer.

\* \* \* \* \*